(12) United States Patent
Lee

(10) Patent No.: US 9,013,197 B2
(45) Date of Patent: Apr. 21, 2015

(54) CHIP ON GLASS SUBSTRATE AND METHOD FOR MEASURING CONNECTION RESISTANCE OF THE SAME

(71) Applicant: Dae Geun Lee, Yongin (KR)

(72) Inventor: Dae Geun Lee, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 248 days.

(21) Appl. No.: 13/659,061

(22) Filed: Oct. 24, 2012

(65) Prior Publication Data

US 2014/0021968 A1    Jan. 23, 2014

(30) Foreign Application Priority Data

Jul. 18, 2012 (KR) .................. 10-2012-0078298

(51) Int. Cl.
*G01R 27/02* (2006.01)
(52) U.S. Cl.
CPC ...................................... *G01R 27/02* (2013.01)
(58) Field of Classification Search
CPC ....... G01R 27/02; G01R 27/205; G01R 27/14
USPC ................... 324/715, 609, 345, 173, 174
See application file for complete search history.

(56) References Cited

U.S. PATENT DOCUMENTS

| | | | | |
|---|---|---|---|---|
| 8,278,950 B2* | 10/2012 | Solki | ............................. | 324/705 |
| 2002/0070747 A1* | 6/2002 | Chiang et al. | ................. | 324/765 |
| 2005/0062142 A1* | 3/2005 | Yeh et al. | ....................... | 257/678 |
| 2009/0231821 A1* | 9/2009 | Osawa et al. | ................. | 361/767 |
| 2009/0272974 A1* | 11/2009 | Park et al. | ........................ | 257/48 |
| 2009/0294977 A1* | 12/2009 | Jao | ................. | 257/773 |
| 2010/0295567 A1* | 11/2010 | Chang | ............................ | 324/719 |
| 2011/0233763 A1* | 9/2011 | Pendse et al. | ................. | 257/737 |
| 2011/0284943 A1* | 11/2011 | Hwang et al. | ................. | 257/314 |
| 2012/0218486 A1* | 8/2012 | Lee et al. | ........................ | 349/41 |

* cited by examiner

*Primary Examiner* — Arleen M Vazquez
*Assistant Examiner* — Dominic Hawkins
(74) *Attorney, Agent, or Firm* — Lee & Morse, P.C.

(57) ABSTRACT

A chip on glass substrate includes a substrate, first, second, and third pads that are arranged on the substrate and that are electrically connected to an IC device, and first to fourth conductive patterns. A first conductive pattern is arranged on the substrate, has one end electrically connected to the first pad, and has another end that is electrically floated. Second and third conductive patterns are arranged on the substrate, each have one end electrically connected to the second pad, and each have another end that is electrically floated. A fourth conductive pattern is arranged on the substrate, has one end electrically connected to the third pad, and has another end that is electrically floated.

21 Claims, 7 Drawing Sheets

CHIP ON GLASS SUBSTRATE AND METHOD FOR MEASURING CONNECTION RESISTANCE OF THE SAME

CROSS-REFERENCE TO RELATED APPLICATION

This application claims priority under 35 U.S.C. §119 to Korean Patent Application No. 10-2012-0078298, filed on Jul. 18, 2012, in the Korean Intellectual Property Office, which is incorporated herein by reference in its entirety.

BACKGROUND

Lightweight and slim display devices are being sought as the development and widespread use of a variety of flat panel displays are rapidly increasing. Types of flat panel displays include a liquid crystal display, an organic light emitting display, etc.

SUMMARY

Embodiments may be realized by providing a chip on glass (COG) substrate including a substrate, first to third pads formed on the substrate for being electrically connected to an IC device, a first conductive pattern electrically connected to the first pad and formed on the substrate, second and third conductive patterns electrically connected to the second pad and formed on the substrate, and a fourth conductive pattern electrically connected to the third pad and formed on the substrate. One ends of the first conductive pattern, the second and third conductive patterns and the fourth conductive pattern are electrically connected to the first to third pads, respectively, and the other ends of the first to fourth conductive patterns are electrically floated.

The IC device may include first, second, and third bumps electrically connected to the first, second, and third pads, respectively, and the first, second, and third bumps may be electrically connected to each other. A current source may be connected to the first and second conductive patterns, and a voltage meter may be connected to the fourth and third conductive patterns.

A connection resistance between the substrate and the IC device may be measured based on a current applied from the current source and a voltage measured from the voltage meter. A connection resistance between the substrate and the IC device may be measured by a 4-probe resistance measuring method. Each of the first, second, and third pads and each of the first, second, and third bumps may be electrically connected to each other through an anisotropically conductive film containing conductive particles.

The IC device may have a single bump electrically connected to the first, second, and third pads. A current source may be connected to the first and second conductive patterns, and a voltage meter may be connected to the fourth and third conductive patterns. A connection resistance between the substrate and the IC device may be measured based on a current applied from the current source and a voltage measured from the voltage meter.

Embodiments may also be realized by providing a chip on glass (COG) substrate including a substrate, first to fourth pads formed on the substrate for being electrically connected to an IC device, and first to fourth conductive patterns electrically connected to the first to fourth pads, respectively, and formed on the substrate. One ends of the first to fourth conductive patterns are electrically connected to the first to fourth pads, respectively, and the other ends of the first to fourth conductive patterns are electrically floated.

The IC device may include first, second, third, and fourth bumps electrically connected to the first, second, third, and fourth pads, respectively, and the first, second, third, and fourth bumps may be electrically connected to each other. A current source may be connected to two of the first, second, third, and fourth conductive patterns, and a voltage meter may be connected to the others among the first, second, third, and fourth conductive patterns.

A connection resistance between the substrate and the IC device may be measured based on a current applied from the current source and a voltage measured from the voltage meter. A connection resistance between the substrate and the IC device may be measured by a 4-probe resistance measuring method.

Each of the first, second, third, and fourth pads and each of the first, second, third, and fourth bumps may be electrically connected to each other through an anisotropically conductive film containing conductive particles.

The IC device may have a single bump electrically connected to the first, second, third, and fourth pads. A current source may be connected to two of the first, second, third, and fourth conductive patterns, and a voltage meter may be connected to the others among the first, second, third, and fourth conductive patterns. A connection resistance between the substrate and the IC device may be measured based on a current applied from the current source and a voltage measured from the voltage meter.

Embodiments may also be realized by providing a method for measuring connection resistance of a chip on glass (COG) substrate, the method including forming first to third pads on a substrate, forming a first conductive pattern electrically connected to the first pad on the substrate, forming second and third conductive patterns electrically connected to the second pad on the substrate, forming a fourth conductive pattern electrically connected to the third pad on the substrate, compressing an IC device having first to third bumps on the substrate, and measuring the connection resistance between the substrate and the IC device. One ends of the first conductive pattern, the second and third conductive patterns and the fourth conductive pattern are electrically connected to the first to third pads, respectively, and the other ends of the first to fourth conductive patterns are electrically floated.

Compressing the IC device may include electrically connect the first, second, and third pads to the first, second, and third bumps, respectively, and the first, second, and third bumps may be electrically connected to each other. Measuring the connection resistance may include connecting a current source to the first and second conductive patterns, and connecting a voltage meter to the third and fourth conductive patterns. The connection resistance may be measured based on a current applied from the current source and a voltage measured from the voltage meter.

BRIEF DESCRIPTION OF THE DRAWINGS

Features will become apparent to those of ordinary skill in the art by describing in detail exemplary embodiments thereof with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Advantages and features and methods of accomplishing the same may be understood more readily by reference to the following detailed description of exemplary embodiments and the accompanying drawings. In some embodiments, well-known structures and devices are not shown in order not to obscure the description with unnecessary detail.

It will be understood that when an element or layer is referred to as being "on" or "connected to" another element or layer, it can be directly on or connected to the other element or layer or intervening elements or layers may be present. Like numbers refer to like elements throughout.

It will be understood that, although the terms first, second, etc. may be used herein to describe various elements, these elements should not be limited by these terms. These terms are only used to distinguish one element from another element. Thus, e.g., a first element, a first component or a first section discussed below could be termed a second element, a second component or a second section without departing from the teachings.

Figure 1:
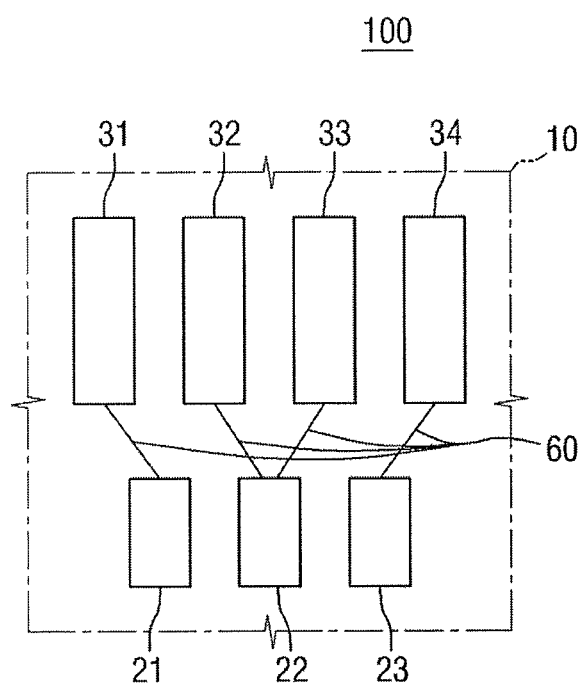
FIGS. 1 and 2 are conceptual diagrams of a chip on glass (COG) substrate according to various exemplary embodiments.
Figure 2:
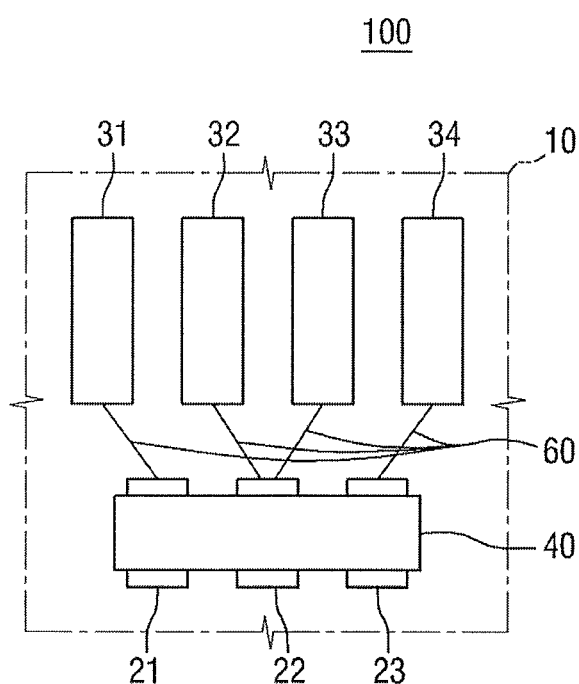

FIGS. 1 and 2 are conceptual diagrams of a chip on glass (COG) substrate according to various exemplary embodiments. Referring to FIG. 1, the COG substrate 100 includes a substrate 10, first to third pads 21, 22, and 23, and first to fourth conductive patterns 31, 32, 33, and 34. In addition, FIG. 2 shows a state in which a separate IC (integrated circuit) device 40 is electrically connected to the COG substrate 100.

Referring to FIGS. 1 and 2, the COG substrate 100 includes a substrate 10 as a base member. The substrate 10 is made of an insulating material, for example, glass or a plastic material.

A variety of wiring patterns or a variety of conductive patterns may be formed on the substrate 10. The wiring patterns or the conductive patterns formed on the substrate 10 may be modified in various manners according to the function performed by elements formed or mounted on the substrate 10. In the specification, for the sake of convenient explanation, a display panel is disposed on the substrate 10 and functions as a display device. However, embodiments are not limited thereto, e.g., the display panel may function as a variety of functional devices.

Referring to FIG. 2, when the display panel is disposed on the substrate 10 to be driven, the separate IC device 40 for supplying a data signal and a driving signal to the display panel may be compressed on the substrate 10. In order to electrically connect the IC device 40 and the display panel disposed on the substrate 10, the first to third pads 21, 22, and 23 are formed on the substrate 10. For the sake of convenient explanation, FIGS. 1 and 2 show that the first to third pads 21, 22, and 23 have rectangular shapes. However, embodiments are not limited thereto, e.g., the first to third pads 21, 22, and 23 may have various other shapes. The first to third pads 21, 22, and 23 will later be described in more detail.

In order to measure a connection resistance between the substrate 10 and the IC device 40, the first to fourth conductive patterns 31, 32, 33, and 34 are formed on the substrate 10. The first to fourth conductive patterns 31, 32, 33, and 34 may be made of conductive materials. In addition, the first to fourth conductive patterns 31, 32, 33, and 34 may be made of substantially the same materials as the first to third pads 21, 22, and 23 and may be formed at substantially the same time. For the sake of convenient explanation, FIGS. 1 and 2 show that the first to fourth conductive patterns 31, 32, 33, and 34 have rectangular shapes. However, embodiments are not limited thereto, e.g., the first to fourth conductive patterns 31, 32, 33, and 34 may have various other shapes.

Referring to FIG. 1, the first conductive pattern 31 is electrically connected to the first pad 21, the second conductive pattern 32 and the third conductive pattern 33 are electrically connected to the second pad 22, and the fourth conductive pattern 34 is electrically connected to the third pad 23.

The first to fourth conductive patterns 31, 32, 33, and 34 may be dummy patterns. Here, the term "dummy pattern" is used to mean that the first to fourth conductive patterns 31, 32, 33, and 34 are used only for measuring connection resistance. Therefore, while one end of the first conductive pattern 31 may be electrically connected to the first pad 21 and the other end of the first conductive pattern 31 may be electrically floated. One end of the second conductive pattern 32 may be electrically connected to the second pad 22, the other end of the second conductive pattern 32 may be electrically floated. One end of the third conductive pattern 33 may be electrically connected to the second pad 22, the other end of the third conductive pattern 33 may be electrically floated. One end of the fourth conductive pattern 34 may be electrically connected to the third pad 23, the other end of the fourth conductive pattern 34 may be electrically floated.

A wiring pattern 60 may be formed on the substrate 10 to electrically connect each of the first to third pads 21, 22, and 23 to the corresponding ones of the first to fourth conductive patterns 31, 32, 33, and 34. The wiring pattern 60 may be made of a conductive material. In some embodiments, the wiring pattern 60 may be directly attached to the substrate 10 by a line one glass (LOG) method.

Referring to FIG. 2, when the display panel is disposed on the substrate 10 to be driven, the IC device 40 for supplying a data signal and a driving signal to the display panel may be compressed on the substrate 10. The compression of the substrate 10 and the IC device 40 will now be described in more detail with reference to FIGS. 3 and 4.

Figure 3:
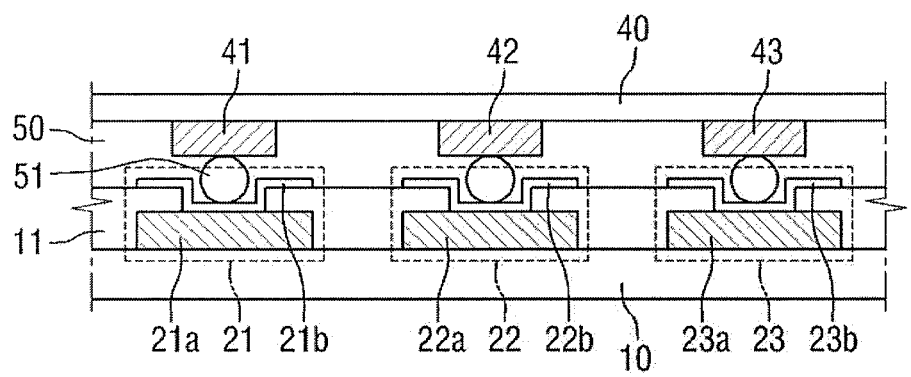
FIGS. 3 and 4 are cross-sectional views of a chip on glass (COG) substrate according to various exemplary embodiments.
Figure 4:
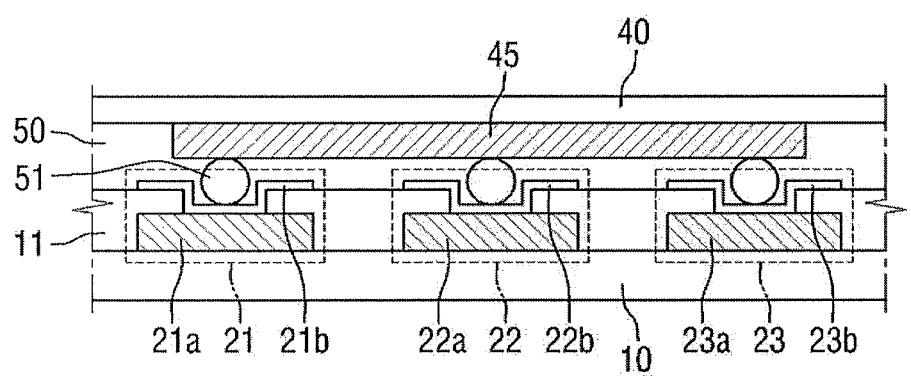

FIGS. 3 and 4 are cross-sectional views of a chip on glass (COG) substrate according to various exemplary embodiments.

Referring to FIGS. 3 and 4, first to third pad terminals 21a, 22a, and 23a made of a conductive material are formed on the substrate 10, and an insulation film 11 may be formed on the first to third pad terminals 21a, 22a, and 23a. The insulation film 11 may include a via hole that opens portions of the first to third pad terminals 21a, 22a, and 23a. First to third pad conductive films 21b, 22b, and 23b formed on the insulation film 11 may be electrically connected to the first to third pad terminals 21a, 22a, and 23a, respectively, through the via hole. The first to third pad conductive films 21b, 22b, and 23b may receive electrical signals from the IC device 40 and transmit the same to the display panel. For example, when a display panel is disposed on the substrate 10, the first to third pad conductive films 21b, 22b, and 23b may be gate lines or data lines.

As described above, the first pad terminal 21a formed on the substrate 10 and the first pad conductive film 21b electrically connected to the first pad terminal 21a through the via hole constitute the first pad 21. The second and third pads 22 and 23 may be formed in the same or substantially the manner as the first pad 21.

Referring to FIG. 3, first to third bumps 41, 42, and 43 may be formed in the IC device 40. The first to third bumps 41, 42, and 43 may be provided, e.g., for transmitting electric signals from the IC device 40 to the substrate 10, and may be made of a conductive material. The first to third bumps 41, 42, and 43 may be electrically connected to each other. In some embodiments, the first to third bumps 41, 42, and 43 may be electrically connected to each other through wirings in the IC device 40.

The first to third bumps 41, 42, and 43 may be electrically connected to the first to third pads 21, 22, and 23, respectively. Referring to FIG. 3, an anisotropically conductive film (ACF) 50, which is an adhesive resin, containing conductive particles 51 may be coated between the substrate 10 and the IC device 40, and the substrate 10 and the IC device 40 may be compressed. If the substrate 10 and the IC device 40 are compressed, the first bump 41 and the first pad 21 may be connected to each other by the conductive particles 51 positioned between the first bump 41 and the first pad 21 among the conductive particles 51 contained in the ACF 50, thereby electrically connecting the first bump 41 and the first pad 21.

Each of the second pad 22 and the third pad 23 and each of the second bump 42 and the third bump 43 may also be electrically connected in the same manner as described above. In some embodiments, each of the first to fourth pads 21, 22, 23, and 24 and each of the first to third bumps 41, 42, and 43 may be electrically connected using a material different from the ACF containing conductive particles but having the same electrical and physical property as the ACF.

Referring to FIG. 4, a single bump 45 may be formed in the IC device 40. The single bump 45 is provided for transmitting an electrical signal from the IC device 40 to the substrate 10 and may be made of a conductive material.

The single bump 45 may be electrically connected to all of the first to third pads 21, 22, and 23. Referring to FIG. 4, the ACF 50, which is an adhesive resin, containing conductive particles 51 may be coated between the substrate 10 and the IC device 40, and the substrate 10 and the IC device 40 may be compressed. If the substrate 10 and the IC device 40 are compressed, the first bump 41 and the first pad 21 are connected to each other by the conductive particles 51 positioned between the single bump 45 and the first pad 21 among the conductive particles 51 contained in the ACF 50, thereby electrically connecting the single bump 45 and the first pad 21. In addition, the single bump 45 and each of the second pad 22 and the third pad 23 may also be electrically connected in substantially the same manner as described above.

Hereinafter, the measuring of connection resistance of the COG substrate 100 will now be described in more detail with reference to FIG. 5.

Figure 5:
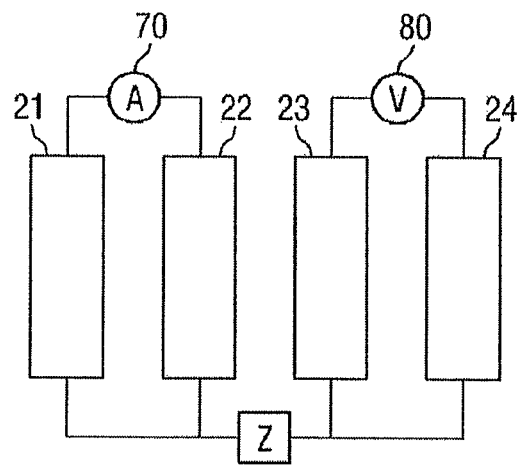
FIG. 5 is a conceptual diagram illustrating a method for measuring connection resistance of a chip on glass (COG) substrate according to an exemplary embodiment.

FIG. 5 is a conceptual diagram illustrating a method for measuring connection resistance of a chip on glass (COG) substrate according to an exemplary embodiment.

Since the first to third bumps 41, 42, and 43 of the IC device 40 shown in FIG. 3 are electrically connected and the single bump 45 is formed on the IC device 40 shown in FIG. 4, the first to third bumps 41, 42, and 43 shown in FIG. 3 and the single bump 45 shown in FIG. 4 may perform the same functions. Hereinafter, for the sake of convenient explanation, the measuring of connection resistance of the COG substrate 100 will be described with reference to the embodiment shown in FIG. 3. However, it is obvious that the connection resistance of the COG substrate shown in FIG. 4 may also be measured in the same manner as in FIG. 3.

Since the first to third bumps 41, 42, and 43 of the IC device 40 are electrically connected and each of the first to third bumps 41, 42, and 43 and each of the first to third pads 21, 22, and 23 are electrically connected, each of the first to third pads 21, 22 and 23 are electrically shorted. For example, the first to third pads 21, 22, and 23 may be three wirings extending from the first to third bumps 41, 42, and 43 electrically connected in the IC device 40. Since the first conductive pattern 31 is electrically connected to the first pad 21, the second conductive pattern 32 and the third conductive pattern 33 are electrically connected to the second pad 22, and the fourth conductive pattern 34 is electrically connected to the third pad 23, the first to fourth conductive patterns 31, 32, 33, and 34 may be four wirings extending from the first to third bumps 41, 42, and 43. The above-described connection mechanism is schematically shown in FIG. 5.

The connection resistance of the COG substrate 100, that is, the connection resistance between the substrate 10 and the IC device 40, may be measured by a 4-probe resistance measuring method. According to the 4-probe resistance measuring method, four probe pins, e.g., four terminals, are connected to a portion from which resistance is to be measured, and the resistance value is calculated based on outputs of the respective probe pins. Two of the four probes are current probe pins to allow a constant current to flow in the portion from which resistance is to be measured. Voltages generated at opposite ends of the portion from which resistance is to be measured can be measured by the other two of the four probes, e.g., voltage probe pins. The resistance value of the portion from which resistance is to be measured can be measured based on a current flowing between the current probe pins and a voltage measured by the voltage probe pins.

To measure the connection resistance of the COG substrate 100 using the 4-probe resistance measuring method, a current source 70 may be connected to the first conductive pattern 31 and the second conductive pattern 32, and a voltage meter 80 may be connected to the fourth conductive pattern 34 and the third conductive pattern 33. For example, the current probe pins may be connected to the first conductive pattern 31 and the second conductive pattern 32, and the voltage probe pins may be connected to the fourth conductive pattern 34 and the third conductive pattern 33.

A gauger may input a constant current value through the current source 70 to allow the current to flow between the first conductive pattern 31 and the second conductive pattern 32. The current may also flow at a portion where the substrate 10 and the IC device 40 are connected to each other. In addition, the gauger may measure voltages of opposite ends of the fourth conductive pattern 34 and the third conductive pattern 33 using the voltage meter 80. Therefore, the connection resistance between the substrate 10 and the IC device 40 based on the current applied from the current source 70 and the voltage measured by the voltage meter 80.

In the COG substrate and the method for measuring the connection resistance of the COG substrate according to various exemplary embodiments, the connection resistance may be measured quantitatively. To check whether a connected state of a compression part is stable or not, the pressed state of an electrode may be determined through human visual inspection or the level of a contrast ratio may be determined using a particular vision system. However, the human visual inspection may include the gauger's subjective determination, and the user of the vision system cannot ensure measuring accuracy. Accordingly, embodiments relate to a COG substrate and the method for measuring the connection resistance of the COG substrate whereas a separate conductive pattern for measuring connection resistance may be formed and the connection resistance may be quantitatively measured so as to accurately determine the stability of the compression part.

Figure 6:
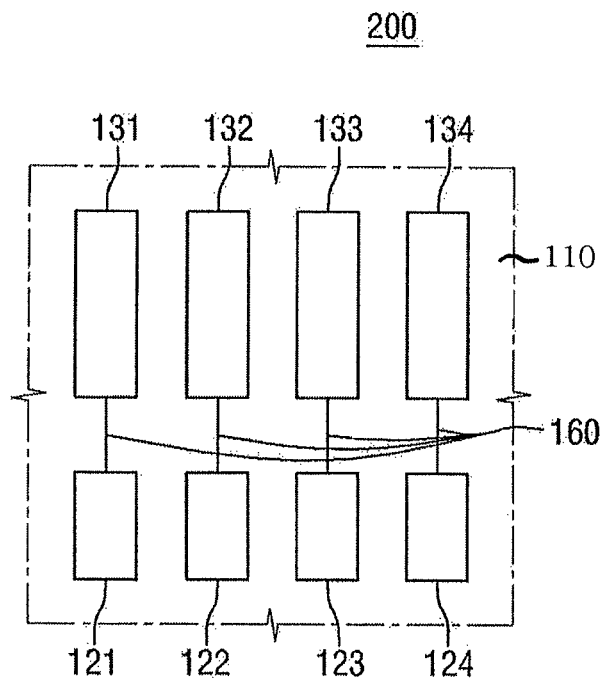
FIGS. 6 and 7 are conceptual diagrams of a chip on glass (COG) substrate according to various exemplary embodiments.
Figure 7:
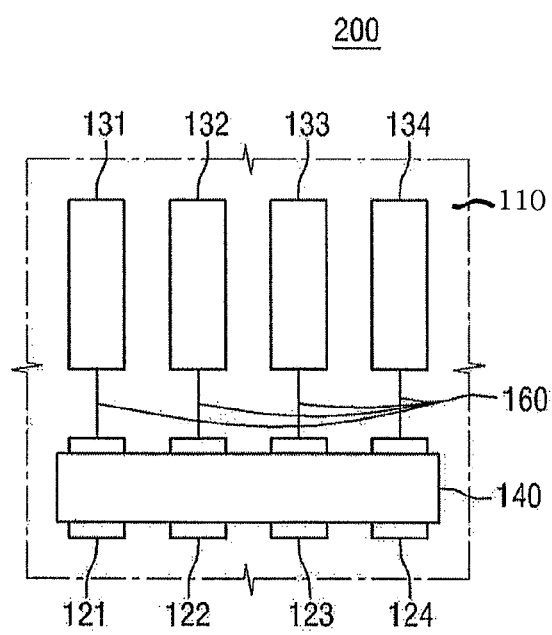

FIGS. 6 and 7 are conceptual diagrams of a chip on glass (COG) substrate according to various exemplary embodiments;

Referring to FIG. 6, the COG substrate 200 includes a substrate 110, first to fourth pads 121, 122, 123, and 124 and first to fourth conductive patterns 131, 132, 133, and 134. FIG. 7 shows a state in which a separate IC device 140 is electrically connected to the COG substrate 200. A substrate 110, a wiring pattern 160 and first to fourth conductive patterns 131, 132, 133, and 134 are substantially the same as the substrate 110, the wiring pattern 160 and the first to fourth conductive patterns 131, 132, 133, and 134 shown in FIGS. 1 to 5, and repeated explanations thereof will be omitted.

In order to electrically connect the substrate 110 and the IC device 40, the first to fourth pads 21, 22, 23, and 24 are formed on the substrate 110 and the first to fourth pads 121, 122, 123, and 124 are electrically connected to the first to fourth conductive patterns 131, 132, 133, and 134, respectively. For example, while one end of the first conductive pattern 131 is electrically connected to the first pad 121, the other end of the first conductive pattern 131 is electrically floated. While one end of the second conductive pattern 132 is electrically connected to the second pad 122, the other end of the second conductive pattern 132 is electrically floated. While one end of the third conductive pattern 133 is electrically connected to the third pad 123, the other end of the third conductive pattern 133 is electrically floated. While one end of the fourth conductive pattern 134 is electrically connected to the fourth pad 124, the other end of the fourth conductive pattern 134 is electrically floated.

Referring to FIG. 7, when a display panel is disposed on the substrate 110 to be driven, a separate IC device 140 for supplying a data signal and a driving signal to the display panel may be compressed on the substrate 110. The compression of the substrate 110 and the IC device 140 will be described in more detail with reference to FIGS. 8 and 9.

Figure 8:
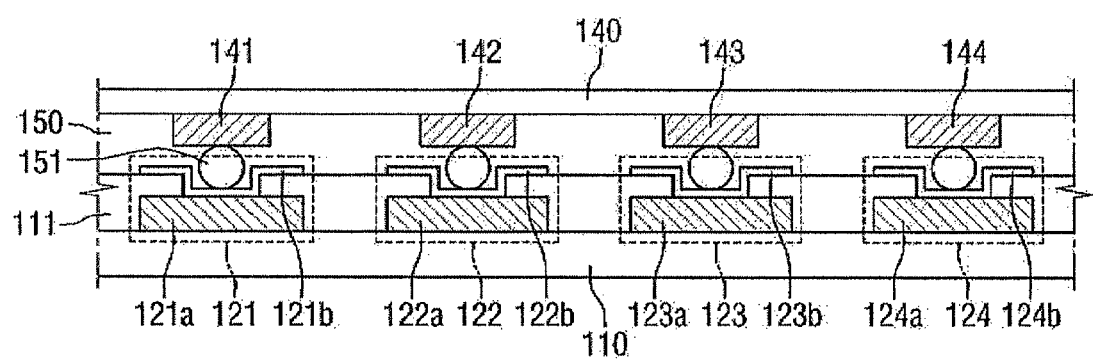
FIGS. 8 and 9 are cross-sectional views of a chip on glass (COG) substrate according to various exemplary embodiments.
Figure 9:
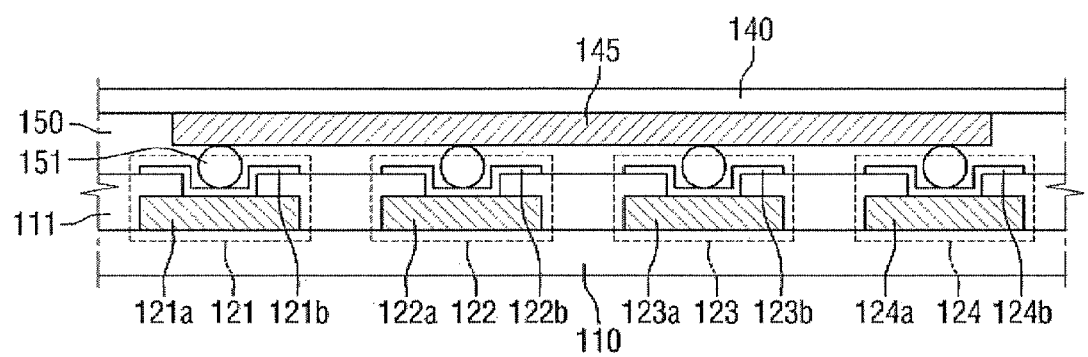

FIGS. 8 and 9 are cross-sectional views of a chip on glass (COG) substrate according to various exemplary embodiments.

First, referring to FIG. 8, the COG substrate 110 is substantially the same as the COG substrate 10 shown in FIG. 3, except that four pads, including first to fourth pads 121, 122, 123, and 124 are formed on the COG substrate 110 and four bumps, including first to fourth bumps 141, 142, 143, and 144, are formed on the IC device 140, and repeated explanations thereof will be omitted.

Next, referring to FIG. 9, the COG substrate 110 is substantially the same as the COG substrate 10 shown in FIG. 4, except that four pads, including first to fourth pads 121, 122, 123, and 124, are formed on the COG substrate 110, and repeated explanations thereof will be omitted.

Hereinafter, the measuring of connection resistance of the COG substrate 200 will now be described in more detail with reference to FIG. 10.

Figure 10:
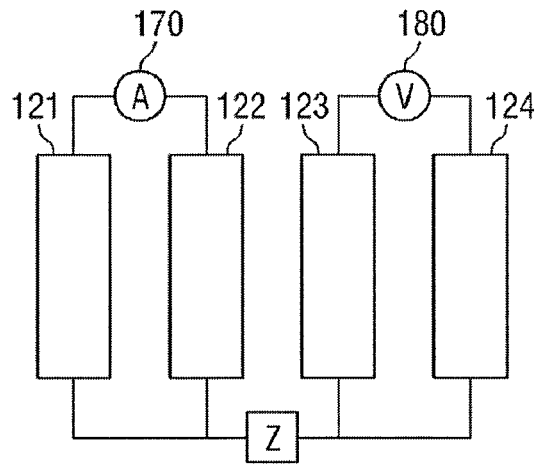
FIG. 10 is a conceptual diagram illustrating a method for measuring connection resistance of a chip on glass (COG) substrate according to an exemplary embodiment.

FIG. 10 is a conceptual diagram illustrating a method for measuring connection resistance of a chip on glass (COG) substrate according to another exemplary embodiment.

Since the first to fourth bumps 141, 142, 143, and 144 of the IC device 140 shown in FIG. 8 are electrically connected and the single bump 145 is formed on the IC device 140 shown in FIG. 9, the first to fourth bumps 141, 142, 143, and 144 shown in FIG. 8 and the single bump 145 shown in FIG. 9 may perform the same functions. Hereinafter, for the sake of convenient explanation, the measuring of connection resistance of the COG substrate 200 will be described with reference to the embodiment shown in FIG. 8. However, it is obvious that the connection resistance of the COG substrate shown in FIG. 9 may also be measured in the same manner as in FIG. 8.

Since the fourth bumps 141, 142, 143, and 144 of the IC device 140 are electrically connected and each of the first to fourth bumps 141, 142, 143, and 144 and each of the first to fourth pads 121, 122, 123, and 124 are electrically connected, each of the first to fourth pads 121, 122, 123, and 124 are electrically shorted. For example, the first to fourth pads 121, 122, 123, and 124 may be four wirings extending from the fourth bumps 141, 142, 143, and 144 electrically connected in the IC device 140. In addition, since the first conductive pattern 131 is electrically connected to the first pad 121, the second conductive pattern 132 is electrically connected to the second pad 122, the third conductive pattern 133 is electrically connected to the third pad 123, and the fourth conductive pattern 134 is electrically connected to the fourth pad 124, the first to fourth conductive patterns 131, 132, 133, and 134 may be four wirings extending from the first to fourth bumps 141, 142, 143, and 144. The above-described connection mechanism is schematically shown in FIG. 10.

The connection resistance of the COG substrate 200, that is, the connection resistance between the substrate 110 and the IC device 140, may be measured by a 4-probe resistance measuring method. To measure the connection resistance of the COG substrate 200 using the 4-probe resistance measuring method, a current source 170 may be connected to the first conductive pattern 131 and the second conductive pattern 132, and a voltage meter 180 may be connected to the fourth conductive pattern 134 and the third conductive pattern 133. Current probe pins may be connected to the first conductive pattern 131 and the second conductive pattern 132, and voltage probe pins may be connected to the fourth conductive pattern 134 and the third conductive pattern 133.

A gauger may input a constant current value through the current source 170 to allow the current to flow between the first conductive pattern 131 and the second conductive pattern 132. The current may also flow at a portion where the substrate 110 and the IC device 140 are connected to each other. In addition, the gauger may measure voltages of opposite ends of the fourth conductive pattern 134 and the third conductive pattern 133 using the voltage meter 180. Therefore, the connection resistance between the substrate 110 and the IC device 140 based on the current applied from the current source 170 and the voltage measured by the voltage meter 180.

In the COG substrate and the method for measuring the connection resistance of the COG substrate according to various exemplary embodiments, the connection resistance can be measured quantitatively. To check whether a connected state of a compression part is stable or not, the pressed state of an electrode may be determined through human visual inspection or the level of a contrast ratio may be determined using a particular vision system. However, the human visual inspection may include gauger's subjective determination, and the use of the vision system cannot ensure measuring accuracy. Accordingly, embodiments relate to a COG substrate and the method for measuring the connection resistance of the COG substrate whereas a separate conductive pattern for measuring connection resistance may be formed and the connection resistance may be quantitatively measured so as to accurately determine the stability of the compression part.

Figure 11:
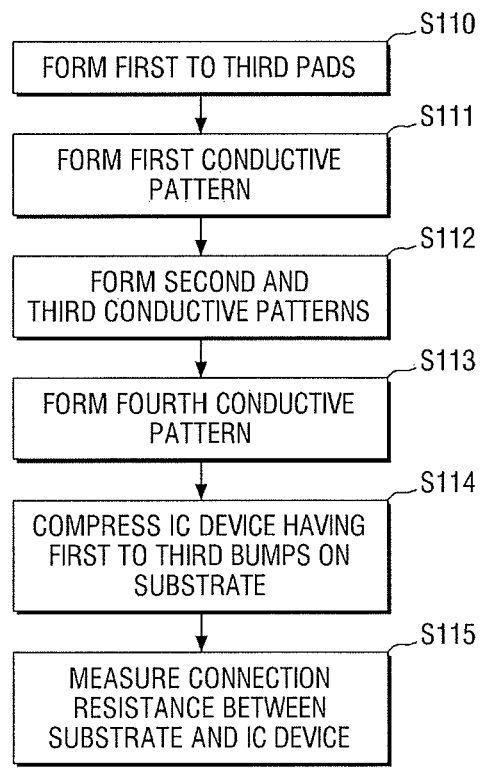
FIG. 11 is a flowchart of a method for measuring connection resistance of a chip on glass (COG) substrate according to an exemplary embodiment.

FIG. 11 is a flowchart of a method for measuring connection resistance of a chip on glass (COG) substrate according to an exemplary embodiment.

First to third pads are formed on a substrate (S110). The forming of the first to third pads on the substrate is substantially the same as the forming of the first to third pads on the substrates shown in FIGS. 1 to 10, and repeated explanations thereof will be omitted.

Next, a first conductive pattern electrically connected to the first pad is formed on the substrate (S111), a second conductive pattern and a third conductive pattern electrically connected to the second pad are formed on the substrate (S112), and a fourth conductive pattern electrically connected to the third pad is formed on the substrate (S113). For the sake of convenient explanation, FIG. 11 shows that the first conductive pattern, the second conductive pattern, the third conductive pattern, and the fourth conductive pattern are sequentially formed in that order. However, embodiments are not limited thereto, e.g., the first to fourth conductive patterns may be simultaneously formed. Further, the first to fourth conductive patterns may be simultaneously formed with the first to third pads. Since the first to fourth conductive patterns are substantially the same as those shown in FIGS. 1 to 10, repeated explanations thereof will be omitted.

Subsequently, an IC device having first to third bumps formed therein is compressed on the substrate (S114). The compression of the first to third bumps, the substrate and the IC device is substantially the same as that shown in FIGS. 1 to 10.

Next, the connection resistance between the substrate and the IC device is measured (S115). The measuring of the connection resistance between the substrate and the IC device is substantially the same as that shown in FIGS. 1 to 10, and repeated explanations thereof will be omitted.

In the COG substrate and the method for measuring the connection resistance of the COG substrate according to various exemplary embodiments, the connection resistance can be measured quantitatively. To check whether a connected state of a compression part is stable or not, the pressed state of an electrode may be determined through human visual inspection or the level of a contrast ratio may be determined through a particular vision system. However, the human visual inspection may include gauger's subjective determination, and the vision system cannot ensure measuring accuracy. Accordingly, embodiments relate to a COG substrate and the method for measuring the connection resistance of the COG substrate whereas a separate conductive pattern for measuring connection resistance may be formed and the connection resistance may be quantitatively measured so as to accurately determine the stability of the compression part.

By way of summation and review, flat panel displays may include a display panel for displaying an image, and a driving device for driving the display panel. The driving device may include a chip for driving the display panel (such as an integrated circuit device) and a substrate (such as a flexible printed circuit device) that are connected to a pad region so as to be mounted as a chip on glass (COG) with an external driving circuit. To verify compression stability of a product compressed in the form of COG, the connection resistance may be measured to examine whether the product is defective or not.

Embodiments relate to a COG substrate and a method for measuring connection resistance of the same. Further, embodiments provide a COG substrate that can easily and accurately measure connection resistance of a compression part, and a method for measuring connection resistance of the same. For example, to verify the stability of a compressed state of a COG substrate, the COG substrate can accurately measure its connection resistance. Also, embodiments provide a method for measuring connection resistance of the COG substrate.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. It is therefore desired that the present embodiments be considered in all respects as illustrative and not restrictive, reference being made to the appended claims rather than the foregoing description to indicate the scope of the invention.

What is claimed is:

1. A chip on glass substrate, comprising:
a substrate;
first, second, and third pads that are arranged on the substrate and that are electrically connected to an IC device;
a first conductive pattern that is arranged on the substrate, that has one end electrically connected to the first pad, and that has another end that is electrically floated such that the first conductive pattern is only electrically connected to the first pad;
second and third conductive patterns that are arranged on the substrate, that each have one end electrically connected to the second pad, and that each have another end that is electrically floated such that the second and third conductive patterns are only electrically connected to the second pad; and
a fourth conductive pattern that is arranged on the substrate, that has one end electrically connected to the third pad, and that has another end that is electrically floated such that the fourth conductive pattern is only electrically connected to the third pad.

2. The chip on glass substrate of claim 1, wherein the IC device includes first, second, and third bumps electrically connected to the first, second, and third pads, respectively, the first, second, and third bumps being electrically connected to each other.

3. The chip on glass substrate of claim 2, wherein the first and second conductive patterns are configured to be connected to a current source, and the fourth and third conductive patterns are configured to be connected to a voltage meter.

4. The chip on glass substrate of claim 3, wherein a connection resistance between the substrate and the IC device is measured based on a current applied from the current source and a voltage measured from the voltage meter.

5. The chip on glass substrate of claim 3, wherein a connection resistance between the substrate and the IC device is measured by a 4-probe resistance measuring method.

6. The chip on glass substrate of claim 2, wherein each of the first, second, and third pads and each of the first, second, and third bumps are electrically connected to each other through an anisotropically conductive film containing conductive particles.

7. The chip on glass substrate of claim 1, wherein the IC device has a single bump electrically connected to the first, second, and third pads.

8. The chip on glass substrate of claim 7, wherein the first and second conductive patterns are configured to be connected to a current source, and the fourth and third conductive patterns are configured to be connected to a voltage meter.

9. The chip on glass substrate of claim 8, wherein a connection resistance between the substrate and the IC device is measured based on a current applied from the current source and a voltage measured from the voltage meter.

10. A chip on glass substrate, comprising:
a substrate;
first, second, third, and fourth pads that are arranged on the substrate and that are electrically connected to an IC device;
first, second, third, and fourth conductive patterns that are arranged on the substrate, that have ends electrically connected to the first, second, third, and fourth pads, respectively, and that have other ends that are electrically floated such that the first, second, third, and fourth conductive patterns are only electrically connected to the first, second, third, and fourth pads, respectively.

11. The chip on glass substrate of claim 10, wherein the IC device includes first, second, third, and fourth bumps electrically connected to the first, second, third, and fourth pads, respectively, the first, second, third, and fourth bumps being electrically connected to each other.

12. The chip on glass substrate of claim 11, wherein two of the first, second, third, and fourth conductive patterns are configured to be connected to a current source, and others among the first, second, third, and fourth conductive patterns are configured to be connected to a voltage meter.

13. The chip on glass substrate of claim 12, wherein a connection resistance between the substrate and the IC device is measured based on a current applied from the current source and a voltage measured from the voltage meter.

14. The chip on glass substrate of claim 12, wherein a connection resistance between the substrate and the IC device is measured by a 4-probe resistance measuring method.

15. The chip on glass substrate of claim 11, wherein each of the first, second, third, and fourth pads and each of the first, second, third, and fourth bumps are electrically connected to each other through an anisotropically conductive film containing conductive particles.

16. The chip on glass substrate of claim 10, wherein the IC device has a single bump electrically connected to the first, second, third, and fourth pads.

17. The chip on glass substrate of claim 16, wherein two of the first, second, third, and fourth conductive patterns are configured to be connected to a current source, and the others among the first, second, third, and fourth conductive patterns are configured to be connected to a voltage meter.

18. The chip on glass substrate of claim 17, wherein a connection resistance between the substrate and the IC device is measured based on a current applied from the current source and a voltage measured from the voltage meter.

19. A method for measuring connection resistance of a chip on glass substrate, the method comprising:
forming first, second, and third pads on a substrate;
forming a first conductive pattern having one end electrically connected to the first pad on the substrate and having another end that is electrically floated such that the first conductive pattern is only electrically connected to the first pad;
forming second and third conductive patterns that each have one end electrically connected to the second pad on the substrate and that each have another end that is electrically floated such that the second and third conductive patterns are only electrically connected to the second pad;
forming a fourth conductive pattern having one end electrically connected to the third pad on the substrate and having another end that is electrically floated such that the fourth conductive pattern is only electrically connected to the third pad;
compressing an IC device having first, second, and third bumps on the substrate; and
measuring a connection resistance between the substrate and the IC device.

20. The method of claim 19, wherein compressing the IC device includes electrically connecting the first, second, and third pads to the first, second, and third bumps, respectively, the first, second, and third bumps being electrically connected to each other.

21. The method of claim 19, wherein:
measuring the connection resistance includes connecting a current source to the first and second conductive patterns, connecting a voltage meter to the third and fourth conductive patterns, and
the connection resistance is measured based on a current applied from the current source and a voltage measured from the voltage meter.

* * * * *